US007678506B2

(12) United States Patent
Tsukagoshi et al.

(10) Patent No.: US 7,678,506 B2
(45) Date of Patent: Mar. 16, 2010

(54) HOLOGRAPHIC RECORDING MEDIUM AND METHOD FOR MANUFACTURING THE SAME

(75) Inventors: Takuya Tsukagoshi, Sagamihara (JP); Jiro Yoshinari, Tokyo (JP); Hideaki Miura, Tokyo (JP); Tetsuro Mizushima, Moriguchi (JP)

(73) Assignee: TDK Corporation, Tokyo (JP)

( * ) Notice: Subject to any disclaimer, the term of this patent is extended or adjusted under 35 U.S.C. 154(b) by 499 days.

(21) Appl. No.: 10/574,080

(22) PCT Filed: Sep. 29, 2004

(86) PCT No.: PCT/JP2004/014238

§ 371 (c)(1),
(2), (4) Date: Mar. 30, 2006

(87) PCT Pub. No.: WO2005/036278

PCT Pub. Date: Apr. 21, 2005

(65) Prior Publication Data

US 2007/0013981 A1     Jan. 18, 2007

(30) Foreign Application Priority Data

Oct. 8, 2003    (JP)    ............................. 2003-348970

(51) Int. Cl.
*G03H 1/02* (2006.01)
(52) U.S. Cl. ................................. 430/1; 430/2; 359/3
(58) Field of Classification Search ................... None
See application file for complete search history.

(56) References Cited

U.S. PATENT DOCUMENTS 4,842,968 A * 6/1989 Kojima et al. .................. 430/1
5,898,511 A * 4/1999 Mizutani et al. ............... 359/13
5,932,045 A * 8/1999 Campbell et al. ............ 156/102
6,077,629 A * 6/2000 Parker et al. .................... 430/1
6,268,089 B1   7/2001 Chandross et al.
6,479,193 B1   11/2002 Maeda et al.
6,524,771 B2   2/2003 Maeda et al.

(Continued)

FOREIGN PATENT DOCUMENTS

JP    A 6-148880    5/1994

(Continued)

OTHER PUBLICATIONS

Abstract of JP 06-148880.*

*Primary Examiner*—Martin J Angebrannct
(74) *Attorney, Agent, or Firm*—Oliff & Berridge, PLC

(57) ABSTRACT

A holographic recording medium in which a thick holographic recording layer is formed without the use of multilayering and without accompanying thickness unevenness, scattering, and nonuniformity of dynamic range, and a method for manufacturing the same. The holographic recording medium 10 is configured by sandwiching a hybrid material layer 14 and a photopolymer layer 16 between first and second substrates 12 and 18. The hybrid material layer 14 contains an inorganic glass and a photopolymer as main ingredients. The photopolymer layer 16 subjected to heat or ultraviolet curing is provided on the dried hybrid material layer 14 such that the combined thickness of this hybrid material layer 14 and the photopolymer layer 16 is uniform. The second substrate 18 is bonded and fixed to this photopolymer layer 16 serving as a bonding layer.

2 Claims, 3 Drawing Sheets

U.S. PATENT DOCUMENTS

| | | |
|---|---|---|
| 7,163,769 B2 * | 1/2007 | Cheben et al. ............... 430/1 |
| 2002/0004172 A1 | 1/2002 | Maeda et al. |
| 2002/0030360 A1 * | 3/2002 | Herrmann et al. ........... 283/72 |
| 2002/0110740 A1 * | 8/2002 | Otaki et al. ................. 430/1 |
| 2003/0025955 A1 * | 2/2003 | Curtis ........................ 359/35 |
| 2003/0044576 A1 * | 3/2003 | Dhar et al. ................. 428/137 |
| 2003/0044577 A1 * | 3/2003 | Dhar et al. ................. 428/137 |
| 2003/0148039 A1 * | 8/2003 | Blum et al. ................. 427/557 |

FOREIGN PATENT DOCUMENTS

| | | |
|---|---|---|
| JP | B2 2953200 | 7/1999 |
| JP | A 11-344917 | 12/1999 |
| JP | B2 3039165 | 3/2000 |
| JP | A 2000-172154 | 6/2000 |
| JP | A 2000-221868 | 8/2000 |

* cited by examiner

HOLOGRAPHIC RECORDING MEDIUM AND METHOD FOR MANUFACTURING THE SAME

TECHNICAL FIELD

The present invention relates to a holographic recording medium for recording interference fringes by projecting an object beam and a reference beam and to a method for manufacturing the same.

BACKGROUND ART

As a material for a holographic recording medium, for example, compositions for optical recording have been proposed in which a photopolymer is filled into a film of an inorganic glass network, as disclosed in the publications of Japanese Patent Nos. 2953200 and 3039165. Further, various materials have been proposed as the abovementioned photopolymer.

In the invention of the abovementioned patent publications, a holographic recording medium is configured by sandwiching a hybrid material or a photopolymer between a pair of glass substrates.

For the holographic recording medium as mentioned above, the thicker a recording layer, the better as a volume type holographic recording medium. However, the formation of a thick film of the abovementioned hybrid material or photopolymer is technologically difficult, and there arise problems such as scattering due to uneven thickness and nonuniformity of remaining dynamic range (to be described hereinafter).

Moreover, it is conceivable that multiple layers of the above material may be laminated to configure a thick recording layer. However, in this case, the number of manufacturing steps increases to cause a problem that manufacturing cost increases.

DISCLOSURE OF THE INVENTION

This invention has been achieved in view of the foregoing problems. It is an object of the invention to provide a holographic recording medium having a recording layer of sufficient and uniform thickness without the use of multilayering and to provide a method for manufacturing the same.

The present inventor has made intensive studies and found that the formation of a thick film can be achieved, without the use of multilayering, by coating a layer of a hybrid material containing an inorganic glass and a photopolymer as main ingredients with a photopolymer layer serving as a bonding layer to thereby configure a recording layer.

In summary, the above-described objectives are achieved by the following aspects of the present invention.

(1) A holographic recording medium, comprising: a first substrate; a hybrid material layer which is formed on this first substrate and contains an inorganic glass and a photopolymer as main ingredients; a photopolymer layer which is formed on this hybrid material layer and is subjected to heat or ultraviolet curing; and a second substrate which is disposed on this photopolymer layer in contact with the photopolymer layer and is bonded and fixed to the photopolymer layer.

(2) The holographic recording medium according to (1), wherein a thickness of the photopolymer layer is adjusted such that a combined thickness of the photopolymer layer and the hybrid material layer is uniform.

(3) The holographic recording medium according to (1) or (2), wherein a thickness of the photopolymer layer in a thickest portion is 5 μm to 50 μm.

(4) The holographic recording medium according to any one of (1) to (3), wherein a remaining dynamic range, a refractive index, photosensitivity, an absorption coefficient, and a shrinkage factor per unit exposure of the hybrid material layer and those of the photopolymer layer are made approximately the same.

(5) A method for manufacturing a holographic recording medium, comprising: a step of applying a liquid hybrid material formed by filling an inorganic glass network to a first substrate with a photopolymer; a step of gelating and drying the applied hybrid material to form a hybrid material layer; a step of applying a liquid photopolymer which is cured by heat or light to the surface of the hybrid material layer; a step of placing a second substrate on the photopolymer in parallel to the first substrate before the applied photopolymer is cured to thereby sandwich the hybrid material layer and the photopolymer between the first substrate and the second substrate; and a step of allowing the photopolymer to cure by heat or light in the sandwiched state to thereby form a photopolymer layer.

(6) The manufacturing method for a holographic recording medium according to (5), wherein the photopolymer has a photosensitive band in a long wavelength side of a photosensitive band of the hybrid material or has a thermosetting property and wherein curing is performed in the step of allowing the photopolymer to cure such that photosensitivity thereof is retained.

BEST MODE FOR CARRYING OUT THE INVENTION

Figure 1:
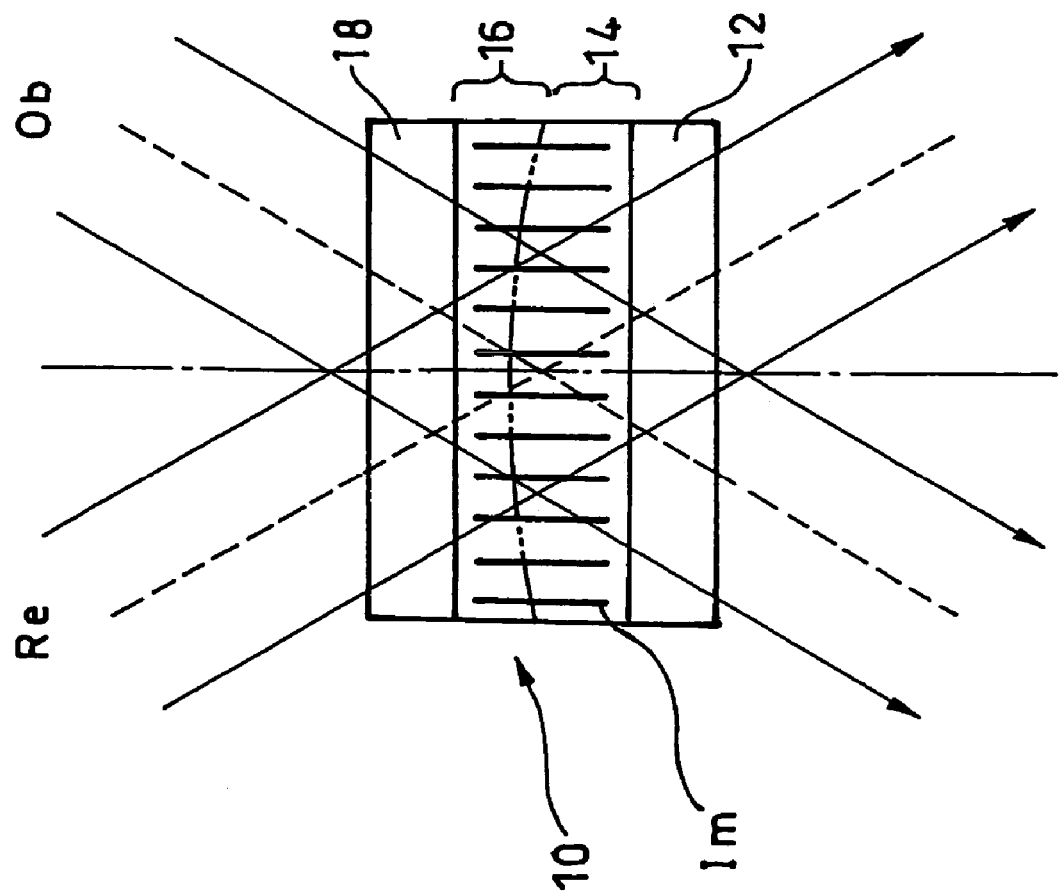
FIG. 1 is a cross-sectional view schematically showing a holographic recording medium according to an embodiment of the present invention.

The above object is achieved by forming, on a hybrid material layer dried and formed on a first substrate, a photopolymer layer such that the combined thickness of the photopolymer layer and the hybrid material layer is uniform and by then bonding a second substrate to the photopolymer layer serving as a bonding layer to thereby configure a holographic recording medium.

First Embodiment

Hereinafter, a first embodiment of the present invention will be described with reference to FIG. 1.

A holographic recording medium 10 according to the first embodiment is configured to have: a first substrate 12; a hybrid material layer 14 which is formed and dried on this first substrate 12 and contains an inorganic glass and a photopolymer as main ingredients; a photopolymer layer 16 which is formed on this hybrid material layer 14 such that the combined thickness of the photopolymer layer 16 and the hybrid material layer 14 is uniform and which has thermosetting or ultraviolet-curing properties; and a second substrate 18 which is arranged on this photopolymer layer 16 in contact with the photopolymer layer 16 and is bonded and fixed thereto upon curing of the photopolymer layer 16.

For the abovementioned first substrate 12 and the second substrate 18 to be described later, a material is employed which is optically flat and transparent to the wavelength of a laser beam for use in holographic recording and reproduction, such as optical glass materials including BK7 and synthetic quartz and translucent plastic materials including polycarbonates and PMMA.

The hybrid material constituting the abovementioned hybrid material layer 14 is a material in which a network configured by an inorganic material (an inorganic glass) is filled with a photopolymer, as one described in, for example, Japanese Patent No. 2953200 or Japanese Patent No. 3039165.

The abovementioned inorganic material contains at least one oxide selected from the group consisting of silicon dioxide, titanium oxide, zirconium oxide, and aluminum oxide.

Further, the photopolymer is preferably a combination of a photopolymerization type monomer and a binder polymer. Since a photopolymer generally has a larger factor of shrinkage due to recording and temperature change as compared to a hybrid material, the thinner photopolymer layer 16 is more preferable. Therefore, for the thickness of the abovementioned photopolymer layer 16, a minimum thickness for compensating the unevenness on the surface of the hybrid material layer 14 after drying is sufficient. Normally, the thickness is 5 to 8 µm in the thickest portion (the leftmost end or the rightmost end in FIG. 1). However, the thickness will be 50 µm at the maximum depending on the surface roughness of the dried hybrid material layer 14.

Further, the material for the photopolymer layer 16 is a thermosetting or light-curing plastic material. However, if a light-curing resin is employed, the photosensitive band thereof must be in the long wavelength side of the wavelength of a laser beam employed for holographic recording and reproduction.

More preferably, a material is selected which is cured by light in the wavelength band in which the hybrid material layer 14 has little or no photosensitivity. Further preferably, after curing by heat or light, the material has photosensitivity to light of a recording-reproducing wavelength.

For example, if holographic recording is performed by use of green light of 532 nm which is the second harmonic component of a Nd:YAG laser, sensitizing dyes each sensitive to red light or green light may be added to a combination of a photopolymerization monomer and a photopolymerization initiator, which serves as a material for the photopolymer layer 16.

For example, polymethylolpropane, polyacrylate or the like is employed as the photopolymerization monomer. Further, examples of the photopolymerization initiator include hexaaryl bisindazole derivatives.

Moreover, examples of the sensitizing dye absorbing red light include cyanine based dyes, and examples of the sensitizing dye absorbing green light include anthracene derivatives.

If photosensitivity is retained in the abovementioned photopolymer layer 16, this photosensitivity and incomplete curing allow the hybrid material layer 14 and the photopolymer layer 16 to have approximately the same remaining dynamic range, refractive index, photosensitivity, absorption coefficient, and shrinkage factor per unit exposure. Thus, also the photopolymer layer 16 acts as a holographic recording material, and the combination of the two layers acts as if this combination is a single recording layer. Therefore, the dynamic range, the photosensitivity, and the thickness of the recording layers (the hybrid material layer 14 and the photopolymer layer 16) are made uniform over the entire holographic recording medium 10. In addition, the increase of the thickness itself of the recording layer allows the dynamic range upon holographic recording to increase.

When a reference beam Re and an object beam Ob are projected onto the holographic recording medium 10 as above as shown in FIG. 1, the interference fringes Im thereof are continuously formed over the hybrid material layer 14 and the photopolymer layer 16.

Here, the remaining dynamic range will be described.

In a volume phase hologram, an interference pattern of two beams is recorded in a recording medium as a refractive index distribution, and a diffraction phenomenon caused by the abovementioned refractive index distribution is utilized upon reproduction. Further, different interference patterns can be superposed and recorded in the same position in a recording medium while the wavelength, the incident angle, or the like of a recording beam is changed. In a holographic memory, this multiplexing is utilized to record a number of pieces of page type digital data in the same position.

The dynamic range is a measure of "how many holograms having a certain diffraction efficiency can be multiplexed." To be precise, the dynamic range is obtained by adding the square roots of the diffraction efficiency of the multiplexed holograms one by one for all the holograms. The dynamic range changes depending on the number of the multiplexed holograms (a multiplicity). However, if the multiplicity exceeds a certain number (several tens), the dynamic range monotonically increases and asymptotically approaches a constant value. In fact, the dynamic range never exceeds 1 when the multiplicity is 1. However, there are some recording materials in which the dynamic range exceeds 10 in a high multiplicity state.

The abovementioned dynamic range is a physical quantity resulting from the refractive index change of a material and, from the viewpoint of the material, corresponds to, for example, the degree of the curing of a photopolymer. Suppose that the refractive index change when the photopolymer is completely cured (the amount of change from an uncured state) is defined as $\Delta n$. If the photopolymer is incompletely cured to result in a refractive index giving $\Delta n1$, the photopolymer still has a capability of changing its refractive index by $\Delta n2 = \Delta n - \Delta n1$. If the photopolymer in this state is employed for hologram recording, the photopolymer has a dynamic range corresponding to a refractive index modulation of $\Delta n2$. This is referred to as the remaining dynamic range.

In the present invention, in view of recording characteristics for use as a recording medium, it is preferable that the degree of curing from the state when the photopolymer is applied be small ($\Delta n2$ be large). However, if the degree of curing is too small, the function as a bonding layer is not exerted. Further, it is preferable that the degree of the curing of the photopolymer be set in view of matching the characteristics with those of the hybrid layer.

Figure 2:
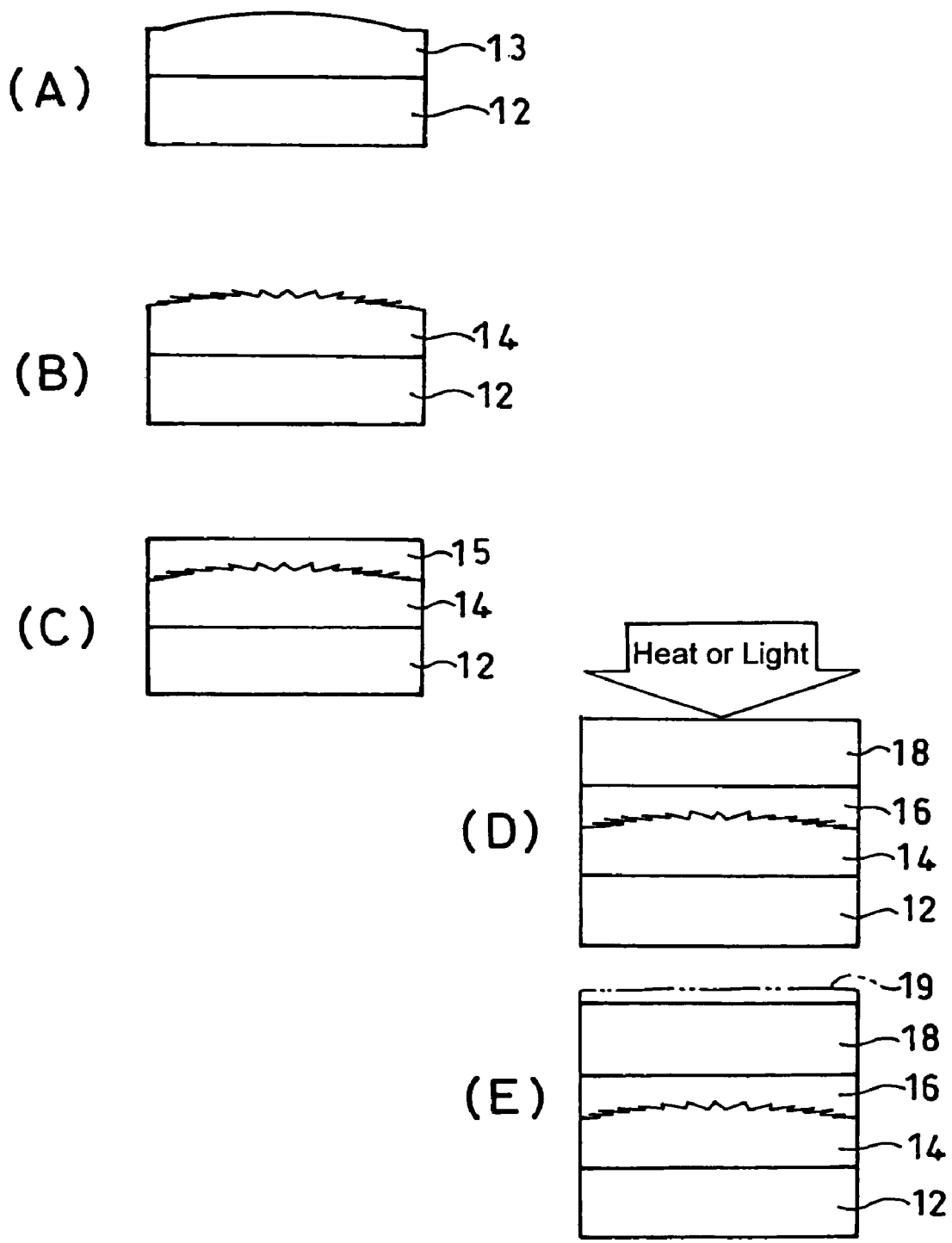
FIG. 2 is an enlarged cross-sectional view schematically showing manufacturing steps of the holographic recording medium.
Figure 3:
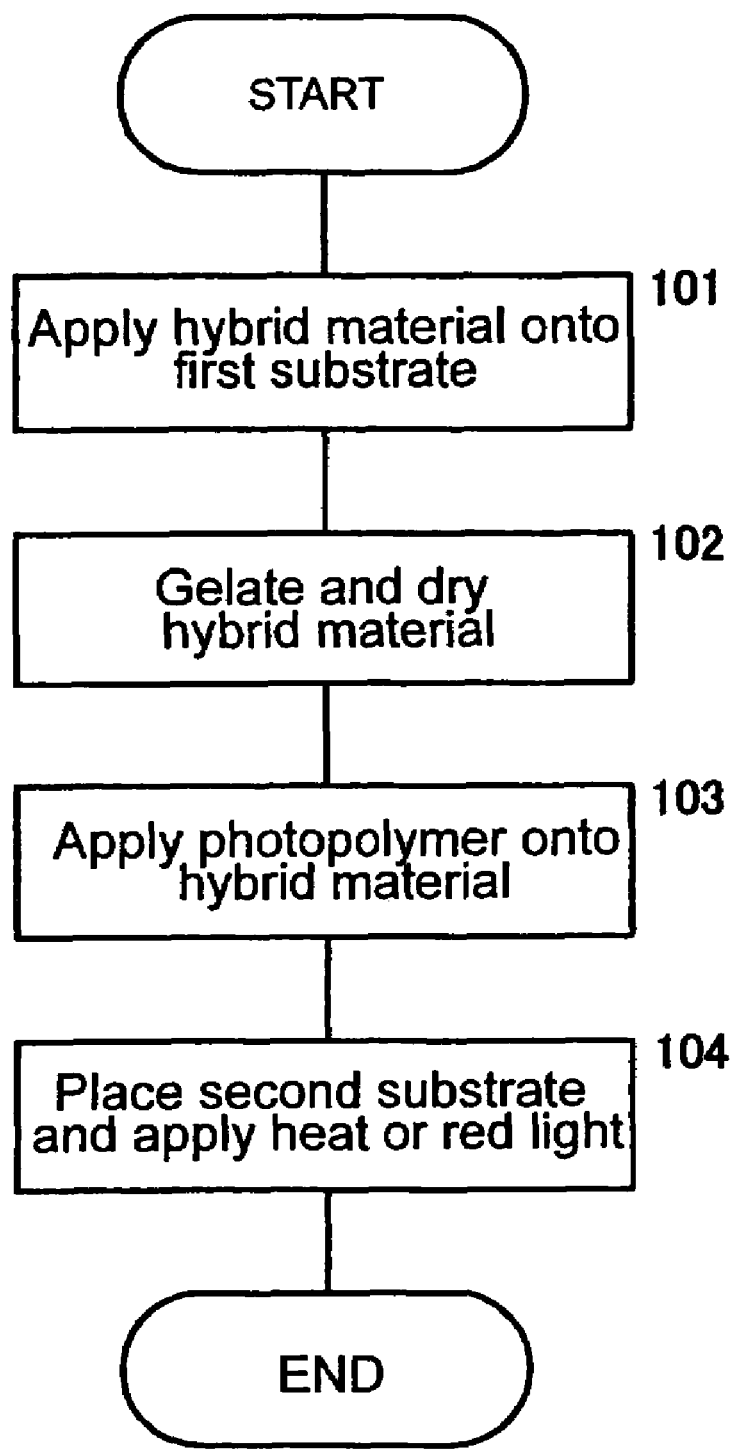
FIG. 3 is a flowchart showing the manufacturing steps.

Next, a manufacturing method of the abovementioned holographic recording medium 10 will be described with reference to FIG. 2 and according to a flowchart of FIG. 3.

Initially, at step 101 (see FIG. 3), a hybrid material 13 serving as a liquid holographic recording material is applied onto the first substrate 12 as shown in FIG. 2(A).

Next, the process proceeds to step 102, and the applied liquid hybrid material 13 is left to stand for 12 to 72 hours for gelation and drying. Water and solvent components are then volatilized, thereby forming the hybrid material layer 14 (see FIG. 2(B)). Physical unevenness is likely to be formed on the surface of the hybrid material layer 14 after drying. This may be because non-uniform shrinking and flow due to surface tension occur when water and solvents are volatilized.

In the present invention, the photopolymer layer 16 is formed on the surface of the abovementioned hybrid material layer 14 after drying as a bonding layer, and the second substrate 18 is affixed thereto to thereby configure the holographic recording medium 10 as shown in FIGS. 2(D) and (E).

More specifically, at step 103, a photopolymer 15 is applied to the surface of the dried hybrid material layer 14 to a thickness at least capable of filling the unevenness of the surface of the hybrid material layer 14, as shown in FIG. 2(C).

Next, at step 104, the second substrate 18 is simply placed on the applied photopolymer layer 15 from the above or is fixed thereto from the above by applying an appropriate pressure in parallel to the first substrate 12 by means of, for example, a press machine, as shown in FIG. 2(D). At this time, since the photopolymer 15 before curing is viscous fluid, the photopolymer 15 in the state of being applied to the hybrid material layer 14 can fill the unevenness on the surface of the hybrid material layer 14 without applying strong pressure or stress to thereby trace the surface shape of the second substrate 18. In addition, the pressure by the press machine or the weight of the second substrate 18 is set such that the preferred shape and thickness of the photopolymer layer 16 can be obtained with the second substrate 18 placed thereon, whereby the second substrate 18 is fixed.

In this state, heat or red light is applied to allow the photopolymer 15 to cure, thereby forming the photopolymer layer 16. In this case, the heat or the red light may be applied until the photopolymer layer 16 is completely cured. However, further preferably, the curing may be terminated in an appropriate state such that the photopolymer layer 16 can function as a bonding layer, thereby allowing the photosensitivity to green light to be retained. As shown in FIG. 2(E), upon completion of the abovementioned curing process, the holographic recording medium 10 as a product is completed.

Further, as shown in FIG. 2(E) by a chain double-dashed line, in order to reduce the light scattering and the surface reflection of a laser beam of a recording wavelength upon holographic recording, a reflection preventing layer 19 may be provided on the outer surface of the first substrate 12 or the second substrate 18.

This reflection preventing layer 19 is formed by laminating a plurality of dielectric thin films having different refractive indices and may be provided on one or both of the first and second substrates 12 and 18 before the manufacturing steps of the holographic recording medium. The reflection preventing layer 19 may be deposited by means of sputtering or the like after the holographic recording medium 10 is manufactured.

The holographic recording medium 10 manufactured as above has excellent optical properties (low light scattering, uniform recording sensitivity) and mechanical properties (uniform thickness, low stress, low shrinkage).

Further, even if the photosensitivity is not retained in the photopolymer layer 16 when the photopolymer layer 16 is cured by the application of heat or red light, improvements such as the reduction of residual stresses in the hybrid material layer 14 and the suppression of the inclusion of air bubbles at the interfaces with both the hybrid material layer 14 and the second substrate 18 may be achieved through the curing of the photopolymer layer 16.

Moreover, if the photosensitivity is retained in the photopolymer layer 16 after the holographic recording medium is completed as described above, this photosensitivity and incomplete curing allow the dynamic range, the photosensitivity, and the thickness of the recording layer (the hybrid material layer 14 and the photopolymer layer 16) to be made uniform over the entire holographic recording medium. In addition, the thickness of the recording layer itself becomes large, thereby obtaining the advantage that the dynamic range upon holographic recording increases. However, in this case, it is desirable that the refractive indices of the hybrid material layer 14 and the photopolymer layer 16 be made the same (index matching) in order to suppress irregular reflection on the interface therebetween.

Further, if recording or reproducing is performed in the hybrid material layer 14 with physical unevenness remaining on the surface thereof as shown in FIG. 2(B), a recording-reproducing beam is scattered by the unevenness on the surface to generate noise light in an amount equal to or greater than an acceptable level. In addition, since the layer thickness of the hybrid material layer 14 is also non-uniform, recording sensitivity and the dynamic range become non-uniform upon holographic recording and reproduction, and therefore good recording-reproducing characteristics are not obtained.

Moreover, a method may be employed in which the second substrate 18 is affixed to the hybrid material layer 14 after drying to thereby form the holographic recording medium. In this case, the hybrid material layer 14 in a gel state has resilience, and therefore the hybrid material layer 14 can be deformed by applying a pressure with the second substrate 18 placed thereon to thereby transfer the flat shape of the substrate.

However, since the surface of the hybrid material layer having unevenness is deformed by pressure, air bubbles may remain in the interface with the second substrate, and cracks may be generated in the hybrid material layer due to the stresses caused by the pressure, thereby causing scattering of light. Further, compression stresses remain in the hybrid material layer. Therefore, as an inorganic network constituting the hybrid material layer is constructed through holographic recording, cracks and migration of materials occur, thereby causing the destruction of recorded data, which is a failure fatal to the recording medium.

INDUSTRIAL APPLICABILITY

In the present invention, a photopolymer layer serving as a bonding layer is formed on the surface of a hybrid material layer having excellent characteristics as a holographic recording material so as to compensate unevenness generated by a manufacturing process, whereby a holographic recording material having a large layer thickness can be obtained without accompanying thickness unevenness, scattering, and non-uniformity of remaining dynamic range.

The invention claimed is:

1. A holographic recording medium, comprising:
   a first substrate;
   a hybrid material layer which is formed on the first substrate, the hybrid material layer including an inorganic glass and a photopolymer as main ingredients;
   a photopolymer layer which is formed on the hybrid material layer and is subjected to heat or ultraviolet curing; and
   a second substrate which is disposed on the photopolymer layer in contact with the photopolymer layer, wherein
   the second substrate is bonded and fixed to the photopolymer layer;
   the first substrate and the second substrate are each composed of a material that is optically flat and transparent to the wavelength of a laser beam for use in holographic recording and reproduction; and
   a thickness of the photopolymer layer in a thickest portion is 5 μm to 8 μm.

2. The holographic recording medium according to claim 1, wherein
   a thickness of the photopolymer layer is adjusted such that a combined thickness of the photopolymer layer and the hybrid material layer is uniform.

* * * * *